United States Patent [19]
Dunstan

[11] Patent Number: 5,714,870
[45] Date of Patent: Feb. 3, 1998

[54] METHOD FOR MEASURING SUSPEND-TIME POWER CONSUMPTION IN A BATTERY-POWERED ELECTRONIC DEVICE

[75] Inventor: Robert Allan Dunstan, Forest Grove, Oreg.

[73] Assignee: Intel Corporation, Santa Clara, Calif.

[21] Appl. No.: 767,361

[22] Filed: Dec. 18, 1996

[51] Int. Cl.$^6$ .......................... H01M 10/44; H01M 10/46
[52] U.S. Cl. ............................................................ 320/43
[58] Field of Search ................................. 320/5, 12, 13, 320/14, 19, 29, 30, 39, 40, 43, 44, 48; 324/427, 428

[56] References Cited

U.S. PATENT DOCUMENTS

| | | | |
|---|---|---|---|
| 5,341,503 | 8/1994 | Gladstein et al. | 320/14 X |
| 5,459,671 | 10/1995 | Duley | 320/43 X |
| 5,565,759 | 10/1996 | Dunstan | 320/48 |
| 5,596,260 | 1/1997 | Moravec et al. | 320/30 |
| 5,600,230 | 2/1997 | Dunstan | 320/48 |
| 5,633,573 | 5/1997 | van Phuoc et al. | 320/5 |
| 5,640,081 | 6/1997 | Austin et al. | 320/48 |

*Primary Examiner*—Edward Tso
*Attorney, Agent, or Firm*—Kenyon & Kenyon

[57] ABSTRACT

A method for measuring power consumed by an electronic device while the electronic device is in a suspended condition includes the steps of determining the charge capacity of an electrical energy storage unit both before and after the electronic device is suspended. This information is then used to calculate charge capacity lost while the electronic device was suspended.

26 Claims, 3 Drawing Sheets

METHOD FOR MEASURING SUSPEND-TIME POWER CONSUMPTION IN A BATTERY-POWERED ELECTRONIC DEVICE

BACKGROUND OF THE INVENTION

The present invention relates generally to the field of power consumption in battery-powered electronic devices, and in particular to a method for measuring battery power consumed by an electronic device while in a suspended condition.

The general trend in the design of electronic devices, and particularly in the design of personal computers, has been towards increased portability, as evidenced by the rapid growth in popularity of notebook computers. Such devices are typically capable of being selectively powered by an internal battery or an external power source using an AC adapter; however, the portable nature of these devices makes battery-powered operations an important consideration for users. With particular reference to notebook computers, nothing frustrates a user more than receiving a "low battery" warning while in the middle of a task, except possibly the loss of data which can occur when a battery "dies" during operation. For this reason, providing users of battery-powered electronic devices with the ability to accurately predict remaining battery life has been an important goal for both designers of such devices and battery manufacturers.

Most previously-proposed solutions to the problem of answering the question "How long will this device continue to operate?" involved using the device's hardware to account for the charge state of a battery. Such solutions have limited utility, generally failing when applied to batteries other than a particular type of battery for which the solution was configured. This occurs, at least in part, because different batteries may have different chemistries and/or charge states which directly affect the battery's capacity. These differences are difficult to account for when capacity is determined with reference to the device's hardware, as opposed to the battery itself.

Recently a consortium of battery manufacturers, chip designers and computer designers jointly published a series of papers collectively referred to as the *Smart Battery System Specifications* to address issues related to batteries used in portable electronic equipment, such as laptop computer systems, cellular telephones and video cameras. As described in the *Smart Battery Data Specification*, Revision 1.0, Feb. 15, 1995 (available from Benchmarq Microelectronics Inc., Duracell Inc., Energizer Power Systems, Intel Corporation, Linear Technology, Maxim Integrated Products, Mistubishi Electric Corporation, National Semiconductor Corporation, Toshiba Battery Co., and Varta Batterie AG), the disclosure of which is incorporated herein by reference, a "smart battery" is a battery equipped with specialized hardware that provides present state, calculated and predicted information to an electronic device in which the battery is installed under software control. A stated goal for such batteries is to provide adequate information for power management and charge control regardless of any particular battery's chemistry.

One possible model for implementing a smart battery system, as described in the *Smart Battery Data Specification*, includes a system host coupled to a smart battery by a bus. The system host may be any electronic device capable of operating on battery power, such as a notebook computer, video camera, cellular phone, or other portable electronic equipment, and the bus physically transports commands and information between the system host and the smart battery.

According to this model, a software interface may be provided to facilitate communications between the battery and the system host. This software interface may be used by the system host to obtain data from the battery either for presentation to a user or for use by a power management system resident in, or coupled to, the system host. Two types of data are available from the battery: factual data and predictive data. Factual data is (1) data that can be measured, such as temperature, pack voltage or charge/discharge current, or (2) a battery characteristic, such as the battery's chemistry. Predictive data is data that is calculated based on the battery's present state and characteristics, such as the battery's remaining life at a present rate of drain. Where the battery is equipped with an internal clock, such predictive data may be presented as a rolling average over a fixed time interval.

One useful application of a smart battery is to facilitate power management in an electronic device by, for example, dynamically determining whether a requested task will harm the system's integrity. For example, spinning up a disk drive in a notebook computer at the end of a battery's charge might cause its output voltage to drop below an acceptable limit, thus causing a system failure. To prevent such a failure, a device driver may query the battery for its current capacity prior to initiating the requested task. If the device driver determines from the returned capacity value that not enough power is available, it may request that the power management system turn off a non-critical power use, such as an LCD screen backlight, and then recheck the sufficiency of the available power.

While smart batteries have been used to monitor power consumption during operation of electronic devices, particularly in battery-powered computers, there presently is no way to monitor power consumption while a battery-powered computer is in a suspended condition. This is because a system host can only retrieve data from a smart battery when the system host is active. Determining suspend-time power consumption may be extremely advantageous, however, enabling users to avoid potentially-disastrous power outages during a suspend period. Such information may be applied, for example, to inform a user of how long a battery-powered device may remain suspended before the system fails due to insufficient battery power.

SUMMARY OF THE INVENTION

An embodiment of the present invention provides a method for measuring power consumed by an electronic device while the electronic device is in a suspended condition. The charge capacity of an electrical energy storage unit is determined both before and after the electronic device is suspended. This information is then used to calculate charge capacity lost while the electronic device was suspended.

DETAILED DESCRIPTION

Figure 1:
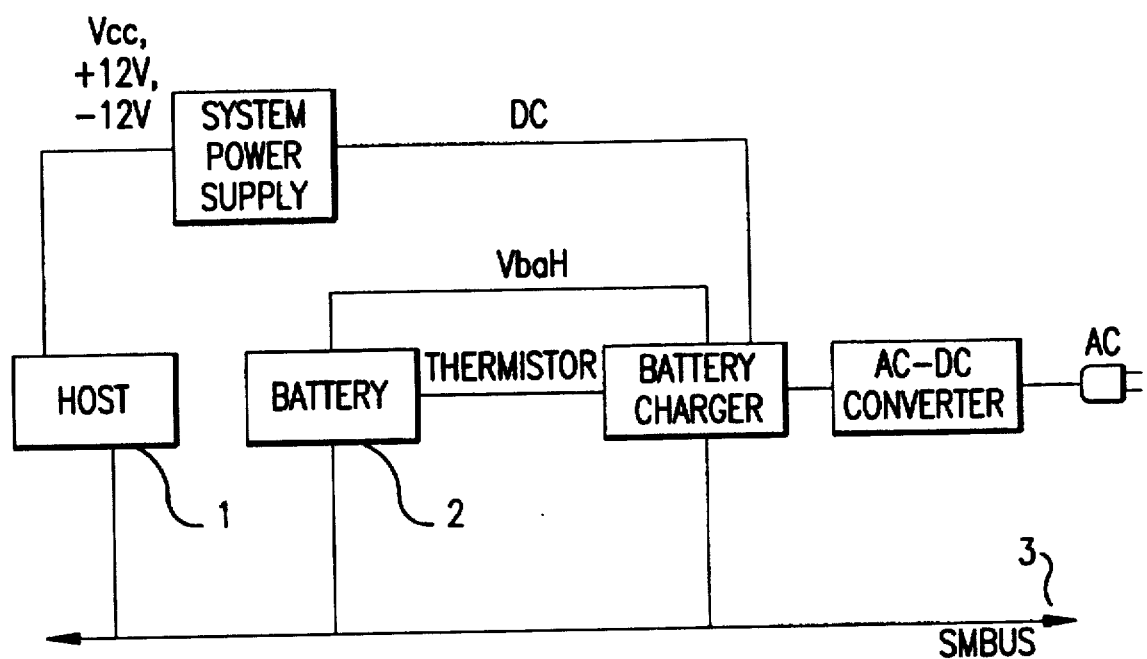
FIG. 1 is a block diagram illustrating a model smart battery-equipped system of a type to which an embodiment of the present invention may be applied.

The present invention provides a method and apparatus for measuring suspend-time power consumption in a battery-powered electronic device. Embodiments of the invention are particularly useful when applied to so-called laptop or notebook computers.

There are three states of a computer system which are commonly referred to as "suspended": "5-volt suspend," "0-volt suspend" and "off." In a 5-volt suspend the system's memory remains powered on so that it retains data; in a 0-volt suspend the system's memory is saved, after which the system memory and all other system hardware are powered off. The off condition is similar to a 0-volt suspend, but there is no saving of system memory. More power is generally consumed during a 5-volt suspend than a 0-volt suspend; however, in almost all battery-powered systems, the system continues to draw some amount of power from the battery unless the battery is disconnected. These suspended conditions are described further below.

5-Volt Suspend

Battery-powered computer systems typically include an auxiliary processor configured to detect key presses, control power to devices, and manage other devices such as the backlight and display. In addition, such systems often include a button dedicated to the suspend/resume function. This auxiliary processor is always running and available to handle infrequent events such as a depression of the suspend/resume button.

If a battery-powered computer system is running and the suspend/resume button is pressed, the auxiliary processor notifies the system by issuing an interrupt and placing information relating to the cause of the interrupt in a register. The main processor of the computer system responds to the interrupt by executing code contained in the APM (Advanced Power Management) BIOS (Binary Input Output System) which determines that the user is requesting to suspend the system. The APM BIOS notifies the operating system that there is a request to suspend, and the operating system queries all applications and drivers to determine whether a suspend is permitted. Assuming none of the queried entities block the suspend, the operating system informs the APM BIOS that the suspend is permitted. In response, the APM BIOS notifies the operating system that it is going to initiate a suspend. The operating system in turn notifies all applications and drivers that the system is being suspended. Following this notification, the operating system informs the APM BIOS that the system is ready to suspend. At this point, the APM BIOS saves the state of all system devices to which it has access and returns control to the auxiliary processor. The auxiliary processor then turns off power to all devices except itself and the system's memory. The system is then deemed to be suspended.

When a resume event is detected, whether initiated by the user or otherwise, the auxiliary processor turns on the devices it controls, possibly reinitializing them, and returns control to the main processor. The main processor in turn executes code contained in the APM BIOS to reinitialize all of the devices to their former states. After the previous state is restored, the main processor resumes execution at the point it left off when the system was suspended.

0-Volt Suspend

The processing for a 0-volt suspend is similar to that just described for a 5-volt suspend, except that the contents of system memory are written to a non-volatile store (usually a separate disk partition) and the memory devices are powered off. Handling of the resume event is also similar, except that the system memory is restored to its prior state (from the contents in the non-volatile store) before the system resumes execution.

Off Condition

The off condition is similar to the 0-volt suspend just described, except that there is no saving/restoration of system memory.

Turning now to particular features of embodiments of the present invention, FIG. 1 illustrates a system to which an embodiment of the present invention may be applied. The system conforms to a model described in the *Smart Battery Data Specification*, Revision 1.0, Feb. 15, 1995 (available from Benchmarq Microelectronics Inc., Duracell Inc., Energizer Power Systems, Intel Corporation, Linear Technology, Maxim Integrated Products, Mistubishi Electric Corporation, National Semiconductor Corporation, Toshiba Battery Co., and Varta Batterie AG), the disclosure of which is incorporated herein by reference.

The system includes, in pertinent part, a host 1 and a battery 2, each of which are coupled to a bus 3. Host 1 may be any battery-powered electronic device, such as a notebook computer, video camera or cellular telephone. While battery 2 is depicted as being distinct from host 1, in practice battery 2 would typically be an internal component of host 1.

Battery 2 may be a so-called smart battery having specialized hardware (not shown) capable of providing present state, calculated and predicted information to host 1 relating, for example, to charge capacity and battery characteristics. Host 1 may communicate requests for information to battery 2 over bus 3, and battery 2 may similarly communicate responsive information and/or information concerning critical events (such as a low charge capacity alarm) to host 1. Bus 3 may be an implementation of an SMBus, which comprises a two-wire bus designed for transporting data between low-speed devices. Further details on the SMBus can be found in the *System Management Bus Specification*, Revision 1.0, February 1995 (available from Benchmarq Microelectronics Inc., Duracell Inc., Energizer Power Systems, Intel Corporation, Linear Technology, Maxim Integrated Products, Mistubishi Electric Corporation, National Semiconductor Corporation, Toshiba Battery Co., and Varta Batterie AG), the disclosure of which is incorporated herein by reference.

The remaining components of the model system illustrated in FIG. 1 are not particularly pertinent to the embodiments of the present invention disclosed herein, and thus are not described in detail. Details on the structure and function of these components can be found in the above-referenced specifications.

Figure 2:
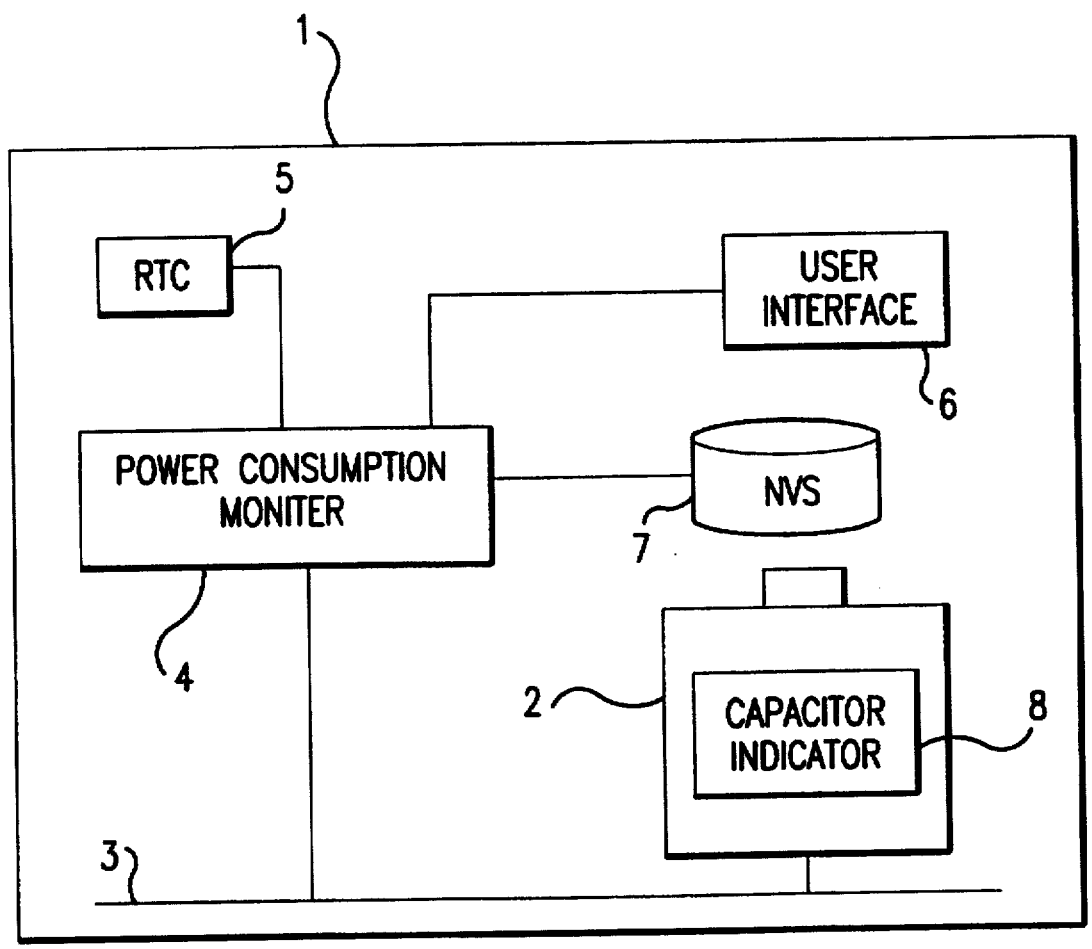
FIG. 2 is a block diagram illustrating a power consumption monitor according to an embodiment of the present invention.

FIG. 2 illustrates a system configured to monitor suspend-time power consumption according to an embodiment of the present invention. For ease of reference, system components common to multiple drawing figures are referenced by the same number in each drawing.

Referring now to FIG. 2, host 1 is coupled to battery 2 across bus 3. The term "battery" is used herein to refer generally to any electrical energy storage unit. As illustrated, battery 2 is coupled to a capacity indicator 8. In this particular embodiment, battery 2 is a "smart battery," and capacity indicator 8 comprises an interface supporting the functions listed in Appendix A of the above-cited *Smart*

*Battery Data Specification*. These functions enable host 1 to retrieve a variety of information about the status and/or characteristics of battery 2. Functions of particular relevance to the present embodiment are discussed below. Capacity indicator 8 may be implemented as software or firmware. Moreover, capacity indicator 8 may be physically separate from battery 2, or it may be an integral component of battery 2.

Host 1 includes a power consumption monitor 4 which manages the retrieval of information from battery 2 and the processing of such information to determine, for example, how much of the capacity of battery 2 is lost during a period of suspended operation of host 1. Power consumption monitor 4 may be implemented as a software module running under control of a CPU (not shown) of host 1. Host 1 may also include a user interface 6 which power consumption monitor 4 uses to communicate power consumption information. Host 1 further includes a real-time clock (RTC) 5 and a non-volatile store (NVS) 7. Real-time clock 5 may be any device configured to maintain an accurate system time regardless of the state of operation (active versus suspended) of host 1. Nonvolatile store 7 may be any "permanent" data store, meaning it maintains its integrity even when host 1 is powered off. Examples of suitable data stores include a hard disk, an EEPROM, and a battery backed-up CMOS RAM. Real-time clocks and non-volatile stores of this type are well-known in the art, and thus are not described in detail herein.

To measure the power consumed by host 1 during a suspended period, power consumption monitor 4 is configured to detect when host 1 is about to suspend. The accuracy of this determination is improved by invoking power consumption monitor 4 as closely as possible to the time host 1 enters a suspended condition, and again as closely as possible to the time host 1 exits the suspended condition.

Any method of identifying initiation of a suspend may be used, and typically involves detecting an interrupt causing a processor to enter a reduced-power mode of operation. For example, where host 1 is a computer with an APM BIOS running a Windows® 95 operating system, the initial invocation of power consumption monitor 4 may be accomplished in a number of different ways depending upon how power consumption monitor 4 is implemented. In such a system, power consumption monitor 4 may be an application (xx.exe), a ring three driver (xx.drv), or a ring zero driver (VxD). In the case of an application or ring three driver, power consumption monitor 4 is able to detect commencement of a suspended condition of host 1 by intercepting a PBT_APMSUSPEND message, and is able to detect termination of the suspended condition by intercepting a PBT_AMPRESUMESUSPEND message. A similar process may be used for ring zero drivers, except the intercepted messages are PWR_SUSPENDREQUEST and PWR_RESUMESUSPEND.

Alternatively, where host 1 is a computer including an APM BIOS and other hardware/firmware, power consumption monitor 4 may be implemented as firmware residing on the platform (that is, the base hardware and firmware) of host 1. The platform captures suspend requests made by software (for example, via the APM BIOS interface) or by some user action (for example, pressing a "Suspend/Resume" button), and likewise captures resume events (for example, a preconfigured system response, such as "wakeup on ring," or a user action, such as pressing the "Suspend/Resume" button again). The platform may be configured to use a main processor in host 1 or an auxiliary processor, such as a keyboard controller, to handle suspend and resume events, and may make capacity loss/time information available for an operating system and/or application software to read, use and/or display.

Power consumption monitor 4 uses capacity readings taken just prior to and just after a suspend period to determine the power consumed by host 1 during the suspend period. Where battery 2 comprises a smart battery, in one embodiment a capacity reading may be accomplished using the RemainingCapacity() function provided by the smart battery interface. As detailed further in the above-cited *Smart Battery Data Specification*, RemainingCapacity() returns a prediction of remaining battery capacity expressed numerically in terms of current (maH at a C/5 discharge rate) or power (10 mwH at a P/5 discharge rate). Alternatively, a capacity reading may be accomplished using either the RelativeStateOfCharge() or AbsoluteStateOfCharge() functions. RelativeStateOfCharge() returns a prediction of remaining battery capacity expressed as a percentage of the battery's FullChargeCapacity() value (another smart battery function); whereas AbsoluteStateOfCharge() returns a prediction of remaining battery capacity expressed as a percentage of the battery's DesignCapacity(). In effect, these smart battery functions provide a reading of the battery's "fuel tank," indicating how much energy remains in battery 2. Where RemainingCapacity() is used, the numeric value may be used directly in calculating a capacity loss; where RelativeStateOfCharge() or AbsoluteStateOfCharge() is used, it may be desirable to first convert the returned percentage to a numerical value.

Figure 3:
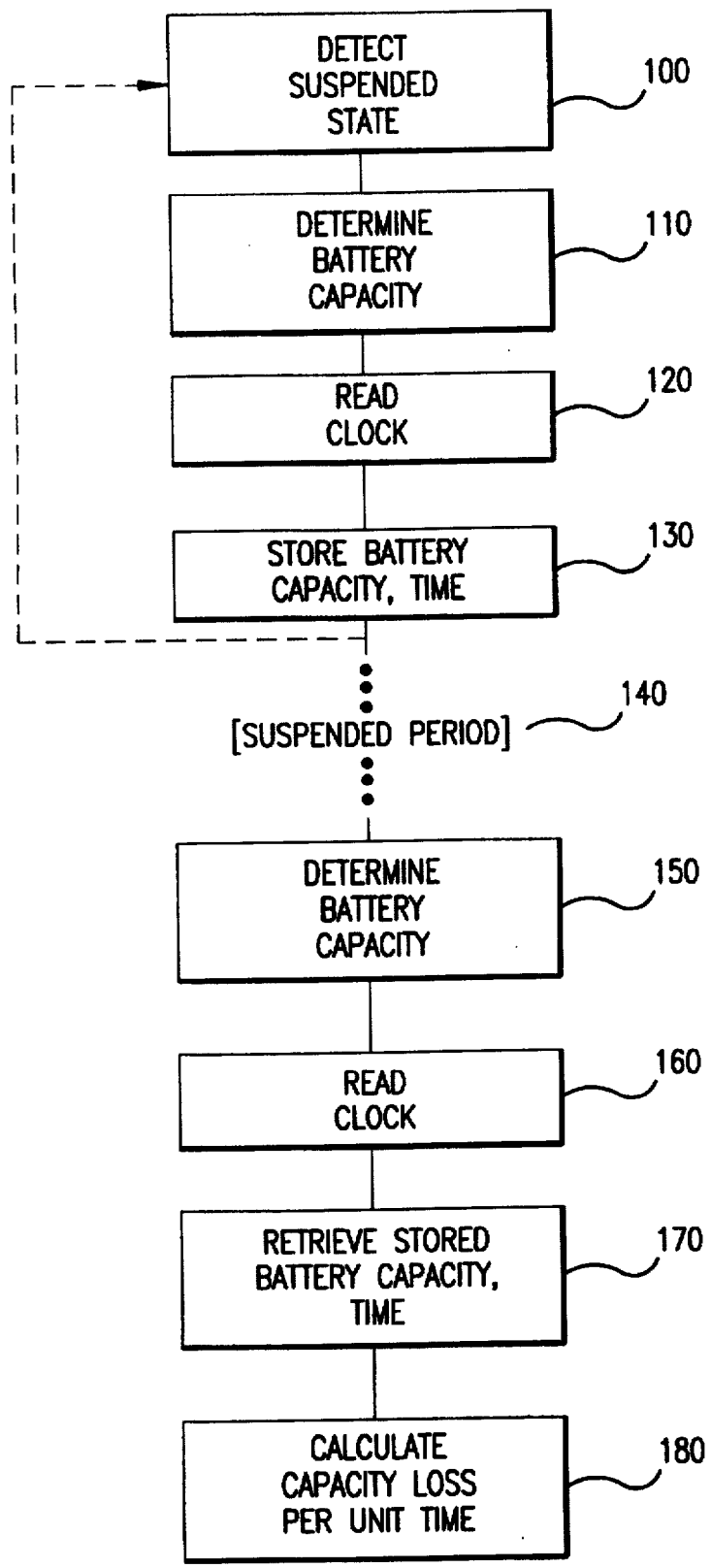
FIG. 3 is a flow chart illustrating a method for determining suspend-time power consumption according to an embodiment of the present invention.

FIG. 3 is a flowchart illustrating a method by which a system, such as the embodiment illustrated in FIG. 2, may be used to determine suspend-time power consumption. Upon being invoked, ideally as close as possible to the time when host 1 is entering a suspended condition, power consumption monitor 4 determines the present capacity of battery 2 (Step 110) and the present reading of real-time clock 5 (Step 120). Power consumption monitor 4 stores these values in non-volatile store 7 as a pre-suspend battery charge capacity and a pre-suspend time indicator (Step 130).

Upon being invoked again, ideally as close as possible to the time when host 1 is reactivated after being suspended, power consumption monitor 4 again determines the present capacity of battery 2 (Step 150) and the present reading of real-time clock 5 (Step 160). These values, representing a post-suspend battery charge capacity and a post-suspend time indicator, may then be compared to the pre-suspend values retrieved from non-volatile store 7 (Step 170) to calculate a value representing capacity loss/time (Step 180). Capacity loss/time may be calculated according to the following formula:

$$\frac{capacity_{pre-suspend} - capacity_{post-suspend}}{time_{post-suspend} - time_{pre-suspend}}$$

Power consumption monitor 4 saves the calculated capacity loss/time in non-volatile store 7, either in the same units returned by the respective smart battery functions used to determine the capacity and time values, or it may convert the value to other units depending upon the particular requirements of a given application. Other alternatives are possible as well.

In one alternate embodiment, power consumption monitor 4 may be configured to periodically update the stored pre-suspend battery charge capacity and time values (Step 110–Step 130) without regard to whether host 1 is about to enter a suspended condition. In the event host 1 does enter a suspended condition, the charge capacity and time values used to calculate capacity loss (Step 180) will be the most-recent sampling prior to the suspend. While potentially less accurate than the preceding embodiment, this embodiment offers the advantage of not having to detect initiation of a suspended condition (Step 100).

Referring again to FIG. 2, power consumption monitor 4 may be coupled to user interface 6 to display information relating to the capacity loss/time. User interface 6 may comprise, for example, an LCD display, a video display monitor, or a printer, along with associated driver software. Alternatively, user interface 6 may be an attached printer. This embodiment of the present invention is not dependent upon any particular type of user interface 6; accordingly, the well-known methods of displaying information to a user are not described herein.

In another embodiment of the present invention, power consumption monitor 4 may be used to provide predictive information to a user relating to how long host 1 may remain suspended without compromising system integrity due to insufficient capacity of battery 2. To do this, power consumption monitor 4 may invoke the AtRateTimeToEmpty() smart battery function. This is actually a two-part function, with the first part being an AtRate() function which may be used to establish a discharge rate. Power consumption monitor 4 may call AtRate() using a previously-stored value for capacity loss/time during suspend periods. A subsequent call to the AtRateTimeToEmpty() function with this AtRate() value returns a number of minutes host 1 can remain suspended before battery 2 is discharged.

Power consumption monitor 4 may periodically refresh the display of predicted permissible suspend time at suitable time intervals, such as every five minutes. The accuracy of this display may be improved by power consumption monitor 4 maintaining a rolling average of calculated capacity loss/time in nonvolatile store 7 to account for any variations in battery discharge behavior.

Power consumption monitor 4 may be implemented as firmware residing on the platform of host 1, such as in a system BIOS, keyboard BIOS or ancillary power BIOS. Alternatively, power consumption monitor 4 may be implemented as pre-loaded software (comprising a set of executable instructions) resident in a memory of an electronic device, such as the hard-disk of a notebook computer. Such software could also be distributed to users in the form of a user-installable program stored on any of a variety of portable media, including diskette and CD. Yet another possibility is that the software could be made available on a network server for downloading upon request by a user.

The embodiments described above relate to indirect methods of measuring suspend-time power consumption in which battery capacity is measured before and after a suspend period. According to another embodiment, power consumption monitor 4 may be configured to measure suspend-time power consumption directly. In such an embodiment, power consumption monitor 4 could be implemented as firmware residing in a structure to which power is supplied even during suspend periods. In the case of a laptop computer, for example, power consumption monitor 4 could be implemented in a microcontroller responsible for detecting when a user depresses a button on host 1, such as the suspend/resume button or the on/off switch. Since such a microcontroller is powered even during suspend periods, power consumption monitor 4 is capable of reading the discharge rate directly from battery 2 while host 1 is suspended.

Embodiments of the present invention may be advantageously applied to provide users of electronic devices with valuable information concerning system power resources.

For example, a user may be presented with a display detailing how long the device may remain in a suspended condition before the capacity of the battery drops below a predetermined capacity level (such as a level associated with a discharged condition of the battery, or a capacity level associated with a minimum amount of energy required to perform basic system operations). Accordingly, embodiments of the present invention may be used to protect the system from an unexpected power loss due to a "dead" battery.

The foregoing is a detailed description of particular embodiments of the present invention. The invention embraces all alternatives, modifications and variations that fall within the letter and spirit of the claims, as well as all equivalents of the claimed subject matter. For example, while the battery was described with reference to a so-called smart battery, capacity information can be obtained from standard batteries using known electronics techniques. In such a case, the power consumption monitor could include software instructions to perform functions analogous to those provided by the referenced smart battery functions.

What is claimed is:

1. A method for measuring power consumed by an electronic device powered by an electrical energy storage unit while the electronic device is in a suspended condition, said method comprising the steps of:

detecting a pre-suspend charge capacity for the electrical energy storage unit;

detecting a post-suspend charge capacity for the electrical energy storage unit; and calculating a capacity loss for the electrical energy storage unit using the pre-suspend and post-suspend charge capacities.

2. The method of claim 1, further comprising the steps of determining a period of time during which the electronic device is in the suspended condition, and using the period of time to calculate a capacity loss over time.

3. The method of claim 2, further comprising the step of using the calculated capacity loss over time to predict how long the electronic device can remain in a suspended condition before the electrical energy storage unit reaches a predetermined capacity level.

4. The method of claim 3, wherein the predetermined capacity level represents an amount of energy required for the electronic device to perform a specified task.

5. The method of claim 1, wherein the electronic device includes a user display device, said method further comprising the step of displaying information relating to the capacity loss on the user display device.

6. A set of instructions residing on a storage medium for measuring power consumed by an electronic device during a period of reduced-power operation, the electronic device including an electrical energy storage unit, a clock and a memory, said set of instructions comprising instructions for:

determining a first charge capacity value from the electrical energy storage unit and a first time value from the clock before the electronic device enters the period of reduced-power operation;

storing the first charge capacity value and the first time value in the memory;

determining a second charge capacity value from the electrical energy storage unit and a second time value from the clock after the electronic device exits the period of reduced-power operation; and calculating a charge capacity loss over time using the first and second charge capacity values and the first and second time values.

7. The set of instructions of claim 6, further comprising instructions for determining a length of time that the electronic device can remain in a subsequent period of reduced-power operation before the electrical energy storage unit reaches a predetermined capacity level.

8. The set of instructions of claim 6, wherein the electronic device includes a user display device, said set of instructions further comprising instructions for reporting information relating to the charge capacity loss over time using the user display device.

9. The set of instructions of claim 6, further comprising instructions for maintaining a rolling average of charge capacity loss over time values in the memory, the rolling average being calculated from a plurality of charge capacity loss over time values corresponding to a plurality of periods of reduced-power operation.

10. The set of instructions of claim 6, wherein the electrical energy storage unit is coupled to a capacity indicator, said steps of determining first and second charge capacity values comprising reading a charge capacity value from the capacity indicator.

11. The set of instructions of claim 10, wherein the capacity indicator is arranged within a housing of the electrical energy storage unit.

12. The set of instructions of claim 10, wherein the electrical energy storage unit comprises a smart battery.

13. An electronic device configured for monitoring power consumed while said electronic device is in a reduced-power condition, said electronic device comprising an electrical energy storage unit powering said electronic device, a processor, a memory, a display device, and a power consumption monitor, said power consumption monitor including a means for respectively determining when said electronic device enters and exits the reduced-power state, a means for determining a charge capacity of said electrical energy storage unit before and after said electronic device is in the reduced-power state, a means for determining a period of time said electronic device is in the reduced-power state, and a means for calculating charge capacity lost by said electrical energy storage unit during the period of time that the electronic device is in the reduced-power state.

14. The electronic device of claim 13, wherein said power consumption monitor further includes a means for calculating a predicted time period that the electronic device can remain in a reduced-power state before the charge capacity of said battery falls below a predetermined charge capacity.

15. The electronic device of claim 13, wherein said electrical energy storage unit comprises a smart battery, said means for determining a charge capacity of said battery comprising an interface providing access to charge capacity data maintained by said smart battery.

16. The electronic device of claim 15, wherein said interface supports a function for returning a present charge capacity for said electrical energy storage unit.

17. The electronic device of claim 15, wherein said interface supports a function for returning a discharge rate for said electrical energy storage unit.

18. The electronic device of claim 13, wherein the reduced-power condition comprises a 5-volt suspend.

19. The electronic device of claim 13, wherein the reduced-power condition comprises a 0-volt suspend.

20. The electronic device of claim 13, wherein the reduced-power condition comprises a powered off condition.

21. An electronic device comprising an electrical energy storage unit and a power consumption monitor, said power consumption monitor being configured to determine a charge capacity of Said electrical energy storage unit both before and after said electronic device is in a reduced-power condition, and to calculate a capacity loss of said electrical energy storage unit using said charge capacities.

22. The electronic device of claim 21, wherein said electronic device comprises a laptop computer.

23. The electronic device of claim 22, wherein said electrical energy storage unit comprises a smart battery.

24. The electronic device of claim 21, further comprising a clock and a data storage unit coupled to said power consumption monitor, said power consumption monitor being configured to detect a charge capacity of said electrical energy storage unit, read a time value from said clock, and store the charge capacity and the time value in said data storage unit.

25. The electronic device of claim 24, wherein said power consumption monitor is configured to detect a charge capacity of said electrical energy storage unit and read a time value from said clock both before and after said electronic device is in a reduced-power condition to calculate said capacity loss.

26. The electronic device of claim 25, further comprising a display device coupled to said power consumption monitor, said power consumption monitor being configured to present information relating to said capacity loss on said display device.

* * * * *

UNITED STATES PATENT AND TRADEMARK OFFICE
CERTIFICATE OF CORRECTION

PATENT NO. : 5,714,870

DATED : 2/3/98

INVENTOR(S) : Dunstan

It is certified that error appears in the above-identified patent and that said Letters Patent is hereby corrected as shown below:

Column 10, line 21, "Said" should be --said--

Signed and Sealed this

Twenty-seventh Day of July, 1999

Attest:

Q. TODD DICKINSON

*Attesting Officer*    *Acting Commissioner of Patents and Trademarks*